(12) United States Patent
Matsushita et al.

(10) Patent No.: US 8,945,341 B2
(45) Date of Patent: Feb. 3, 2015

(54) METHOD AND DEVICE FOR WET TREATMENT OF PLATE-LIKE ARTICLES

(75) Inventors: Masaichiro Ken Matsushita, Kanagawa (JP); Michael Puggl, Sankt Stefan (AT)

(73) Assignee: LAM Research AG, Villach (AT)

( * ) Notice: Subject to any disclaimer, the term of this patent is extended or adjusted under 35 U.S.C. 154(b) by 259 days.

(21) Appl. No.: 13/215,091

(22) Filed: Aug. 22, 2011

(65) Prior Publication Data

US 2013/0048607 A1  Feb. 28, 2013

(51) Int. Cl.
*C23F 1/00* (2006.01)
*H01L 21/67* (2006.01)
*H01L 21/687* (2006.01)

(52) U.S. Cl.
CPC .... *H01L 21/67028* (2013.01); *H01L 21/67051* (2013.01); *H01L 21/68728* (2013.01); *H01L 21/68785* (2013.01)
USPC .................. 156/345.33; 156/345.21; 438/747

(58) Field of Classification Search
USPC ................. 438/704, 706, 710, 711, 747, 748; 156/345.29, 345.33, 55, 345.21, 156/345.23, 345.55
See application file for complete search history.

(56) References Cited

U.S. PATENT DOCUMENTS

| 4,903,717 | A | | 2/1990 | Sumnitsch |
| 5,529,626 | A | * | 6/1996 | Stewart .......................... 118/500 |
| 6,220,771 | B1 | | 4/2001 | Tung et al. |
| 7,195,679 | B2 | | 3/2007 | Xia et al. |
| 7,488,400 | B2 | * | 2/2009 | Koyata et al. ............. 156/345.33 |
| 7,935,217 | B2 | | 5/2011 | Yashiki et al. |
| 2004/0065354 | A1 | * | 4/2004 | Ishizaki et al. .................. 134/30 |
| 2004/0084144 | A1 | * | 5/2004 | Yokouchi et al. ......... 156/345.11 |
| 2007/0207706 | A1 | * | 9/2007 | Takahashi ....................... 451/28 |
| 2008/0293253 | A1 | | 11/2008 | Itzkowitz |
| 2010/0200163 | A1 | * | 8/2010 | Puggi et al. .............. 156/345.21 |
| 2010/0206481 | A1 | | 8/2010 | Gigacher et al. |
| 2011/0151675 | A1 | | 6/2011 | Frank et al. |

OTHER PUBLICATIONS

International Search Report, dated Jan. 24, 2013, from corresponding PCT application.

* cited by examiner

*Primary Examiner* — Lan Vinh
(74) *Attorney, Agent, or Firm* — Young & Thompson

(57) ABSTRACT

A method and device for wet treatment of a plate-like article comprises a spin chuck for holding and rotating the plate-like article. Gas supply nozzles open on a surface of the spin chuck facing a first side of the plate-like article. The spin chuck is configured to direct gas discharged from the gas supply nozzles radially outwardly through a gap defined between an upper surface of the spin chuck and a downwardly facing surface of a plate-like article positioned on the spin chuck. Liquid supply nozzles open on the surface of the spin chuck facing a first side of the plate-like article and positioned radially outwardly of the gas supply nozzles. The liquid supply nozzles are positioned beneath a peripheral region of a plate-like article positioned on the spin chuck.

17 Claims, 2 Drawing Sheets

METHOD AND DEVICE FOR WET TREATMENT OF PLATE-LIKE ARTICLES

BACKGROUND OF THE INVENTION

1. Field of the Invention

The invention relates to a method and device for wet treating a plate-like article.

2. Description of Related Art

Devices for wet processing of single semiconductor wafers typically include a spin chuck for holding a wafer and rotating it as process liquids are applied to an upper surface thereof. An example of such a device is described in U.S. Pat. No. 4,903,717.

During single wafer processing, as a wafer is treated with one side thereof facing upwardly, residues can build up on the peripheral edge of the downwardly-facing wafer side. These residual build-ups can be removed by use of a suitable chemistry or deionized water (DI) on the unprocessed wafer side. However, for device performance reasons, some applications require that no chemistry or DI should contact the unprocessed wafer side. This is particularly the case when the upwardly facing processed side is the underside of the wafer, whereas the downwardly-facing unprocessed side is the device side of the wafer.

U.S. Pat. No. 6,220,771 describes a device for backside protection of a wafer; however that device requires incorporating into the structure of the chuck a stationary annular seat provided with slant nozzles for supplying protection liquid to a water guard ring formed in the underside of the chuck, from which the protection liquid is supplied to the wafer backside through further slant bores that traverse the chuck at every six degrees about its circumference. This solution therefore requires extensive additional structure as well as modifications to the chuck body that could compromise its structural integrity.

U.S. Patent Pub. No. 2008/0293253 describes a device for wet etching the edge and bevel of a wafer, in which an outer channel applies etching liquid to the periphery of the downwardly-facing wafer side, and a concentric inner channel separated from the outer channel supplies gas to the adjacent inner surface of the channel. In this device, however, the etching liquid is in continuous contact with the wafer underside and dedicated venting must be provided for the nitrogen gas flow.

Improved methods and apparatus for removing residues from a peripheral region of one side of a wafer, while not wetting more central areas of that wafer side, would therefore meet a need in this field.

SUMMARY OF THE INVENTION

The present invention in one aspect relates to a device for wet treatment of a plate-like article comprises a spin chuck for holding and rotating the plate-like article. Gas supply nozzles open on a surface of the spin chuck facing a first side of the plate-like article. The spin chuck is configured to direct gas discharged from the gas supply nozzles radially outwardly through a gap defined between an upper surface of the spin chuck and a downwardly facing surface of a plate-like article positioned on the spin chuck. Liquid supply nozzles open on the surface of the spin chuck facing a first side of the plate-like article and positioned radially outwardly of the gas supply nozzles. The liquid supply nozzles are positioned beneath a peripheral region of a plate-like article positioned on the spin chuck.

In preferred embodiments of the device according to the present invention, the spin chuck is adapted to hold a semiconductor wafer in a process module for single wafer wet processing.

In preferred embodiments of the device according to the present invention, the spin chuck comprises a circular series of gripping pins having contact surfaces which, in a closed position of the gripping pins, describe a circle whose diameter corresponds to that of an article to be held by the spin chuck.

In preferred embodiments of the device according to the present invention, the spin chuck comprises a stationary central manifold and a rotary holding portion surrounding an upper part of the stationary central manifold, the stationary central manifold including supply conduits leading to the gas supply nozzles and the liquid supply nozzles.

In preferred embodiments of the device according to the present invention, the rotary holding portion of the spin chuck comprises a rotating liquid conduit communicating with a liquid supply conduit in the stationary central manifold and the liquid supply nozzles.

In preferred embodiments of the device according to the present invention, the rotary holding portion of the spin chuck comprises a rotating gas chamber communicating with a gas supply conduit in the stationary central manifold and the gas supply nozzles.

In preferred embodiments of the device according to the present invention, the rotary holding portion of the spin chuck comprises a rotating gas chamber communicating with a gas supply conduit in the stationary central manifold and the gas supply nozzles, the rotating gas chamber further communicating with the rotating liquid conduit.

In preferred embodiments of the device according to the present invention, the liquid supply nozzles are arranged in a circle with outlet ends thereof directed upwardly and outwardly from a central portion of the spin chuck.

The present invention in another aspect relates to a method of wet treating a plate-like article comprising:

positioning a plate-like article on a spin chuck, rotating the plate-like article with the spin chuck, while supplying gas to a first side of the plate-like article through gas supply nozzles opening on a surface of the spin chuck facing the first side of the plate-like article, directing gas discharged from the gas supply nozzles radially outwardly through a gap defined between an upper surface of the spin chuck and a downwardly facing surface of the plate-like article positioned on the spin chuck; and simultaneously supplying a liquid to only a peripheral region of the first side of the plate-like article through liquid supply nozzles opening on the surface of the spin chuck facing the first side of the plate-like article, and positioned radially outwardly of the gas supply nozzles, the liquid supply nozzles being positioned beneath a peripheral region of a plate-like article positioned on the spin chuck.

In preferred embodiments of the method according to the present invention, prior to supplying liquid to a first side of the plate-shaped article, an etching liquid is dispensed onto an upper surface of the plate-like article while gas is supplied to the lower surface of the plate-shaped article.

In preferred embodiments of the method according to the present invention, during supplying liquid to a first side of the plate-shaped article, a rinsing liquid is dispensed onto an upper surface of the plate-like article while gas is supplied to the lower surface of the plate-shaped article.

In preferred embodiments of the method according to the present invention, the liquid supplied to only a peripheral region of the first side of the plate-like article is deionized water.

In preferred embodiments of the method according to the present invention, the method further comprises supplying gas to the gas supply nozzles such that the gas creates a gas seal confining the liquid within a rotating liquid conduit upstream of the liquid supply nozzles.

In preferred embodiments of the method according to the present invention, the gas supplied through the gas supply nozzles and the liquid supplied through the liquid supply nozzles are intermingled in a region radially outwardly of the liquid supply nozzles.

In preferred embodiments of the method according to the present invention, the gas supplied through the gas supply nozzles and the liquid supplied through the liquid supply nozzles are mixed upstream of the gas supply nozzles and the liquid supply nozzles.

BRIEF DESCRIPTION OF THE DRAWINGS

The accompanying drawings are included to provide a further understanding of the invention. The drawings illustrate embodiments of the invention and together with the description serve more fully to explain the principles of the embodiments of the invention.

DETAILED DESCRIPTION

Figure 1:
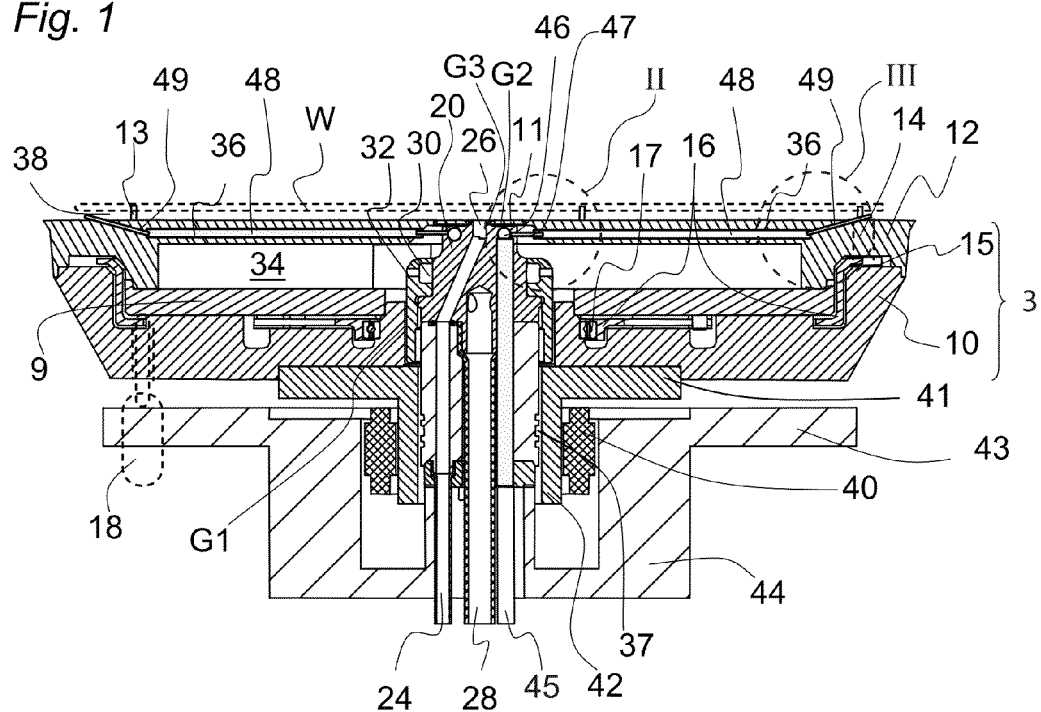
FIG. 1 shows details of a wet treatment apparatus according to an embodiment of the present invention in a cross-sectional view.

The apparatus depicted in FIG. 1 comprises a spin chuck 3 for holding and rotating a wafer W, and a non-rotating nozzle head 20. The spin chuck has a base body 10, which is mounted onto a rotating support plate 41.

The support plate 41 is connected to a rotating hollow shaft 42 (rotor), which is part of a hollow shaft motor 40. The hollow shaft motor has an outer stator 40 and an inner rotor. The stator 40 is connected to a machine frame part 43, 44 with a frame plate 43 and a connecting part 44. The cylinder-like non-rotating nozzle head 20 is connected to the connecting part 44.

The nozzle head 20 therefore leads through the hollow shaft 42 and the support plate 41 leaving a small gap (preferably from 0.05-0.5 mm) to the inner wall of the hollow shaft 42. This gap between the hollow shaft 42 and the nozzle head 20 is sealed by an annular duct 37, which is connected to a suction device (not shown).

The base body 10 of the spin chuck, which is mounted onto the rotating support plate 41, has a central bore whose inner diameter exceeds that of the outer diameter of nozzle head 20 to define a small annular gap, preferably in the range of 0.05-0.5 mm.

A cover plate 12 is mounted onto the base body 10, thereby to define an inwardly open gas distribution chamber 34. The cover plate 12 has a central plate 11, which is mounted to the cover plate 12. The central plate 11 is shaped in order to correspond to the shape of the nozzle head 20, wherein the central plate does not touch the nozzle head 20, leaving a small gap G2 between the nozzle head 20 and the central plate 11 with a distance that is preferably in a range of 0.05 and 0.5 mm. The inner diameter of the hole in central plate 11 surrounds the nozzle 26 leaving a gap G3 with a distance d in a range of 0.05 and 0.5 mm.

At the bottom of the gas distribution chamber 34 a plate 9 is mounted to the base plate 10 leaving a chamber between the base plate 10 and the plate 9 for the ring gear 16. The ring gear 16 is rotatably connected to the base plate 10 via bearing 17. The chamber for the ring gear 16 thus does not have a connection to the gas distribution chamber 34.

The spin chuck 3 comprises six cylindrically shaped holding elements 14 with eccentrically mounted gripping pins 13. The gripping pins 13 are rotated about the holding elements' cylinder axis by the ring gear 16. The ring gear 16 is rotated against the base-body 10 of the spin chuck by holding the ring gear by a vertically movable rod 18 (penetrating through a not shown slit in the base-body) while slightly rotating the base-body with the hollow-shaft motor 40. Thereby the cylindrical holding elements 14 are rotated and the gripping pins 13 turn into open position. The ring gear 16 drives the tooth gears 15, which are part of the holding elements 14.

After a wafer has been placed onto the gas cushion provided through gas nozzles 36 within the gripping pins 13, the base body is turned back and the ring gear 16 turns into closed position driven by springs (not shown). Thereby the gripping pins 13 contact the wafer's edge and securely grip the wafer.

The nozzle head 20 comprises three lines (central fluid line 24, gas line 28, and peripheral liquid line 45), which are substantially parallel to the rotational axis of the spin chuck. The central fluid line 24 leads to the fluid nozzle 26 for treating the wafer surface, which faces the spin chuck.

The gas line 28 is part of the non-rotating part of the gas supply line for providing gas for the gas cushion. In the upper part of the nozzle head the gas line 28 splits into four branches (not shown). The branches of the gas line end in an annular non-rotating gas distribution chamber 30. The non-rotating gas distribution chamber 30 opens into the rotating gas distribution chamber 34 through twelve openings 32.

An annularly arranged plurality of gas nozzles 36 is coaxially arranged with respect to the rotational axis. Each gas nozzle is slanted outwardly by an angle α of about 30° to the rotational axis.

Most of the gas supplied from the non-rotating gas distribution chamber 30 into the rotating gas distribution chamber 34, is dispensed through the openings 36 for providing the gas cushion in the gap 38 between the wafer and the cover plate 12. The rest of the gas, which has been introduced into the rotating gas distribution chamber 34, either escapes through the nozzles 49 as described below, or is used for purging the gaps G1, G2, and G3 between the non-rotating nozzle head 20 and the spin chuck 3, where G1 is the gap between the nozzle head 20 and the base body 10 of the spin chuck.

Peripheral liquid supply line 45 leads to an annular distribution conduit 46 formed in the stationary nozzle head, which in turn supplies liquid to the non-rotating feed nozzles 47. The non-rotating nozzles 47 feed into the rotating conduit 48, as shown in greater detail in FIG. 2. Rotating conduit 48 may be a hollow volume formed in cover plate 12, or may instead be a series of separate radially outwardly extending pipes interconnecting non-rotating nozzles 47 with edge rinsing nozzles 49.

Figure 3:
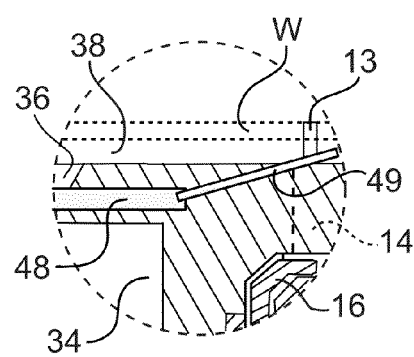
FIG. 3 is an enlarged view of the detail III in FIG. 1.

Edge rinsing nozzles 49 may be tubular conduits or bores opening at their inner end on the rotating conduit 48, and opening at their outer end on or slightly above the upwardly-facing surface of the chuck 3 that is facing the first side of a wafer held on the chuck. As shown in greater detail in FIG. 3, edge rinsing nozzles 49 are inclined relative to the horizontal at an angle that is preferably from 15° to 45°, and more preferably about 30°.

Figure 4:
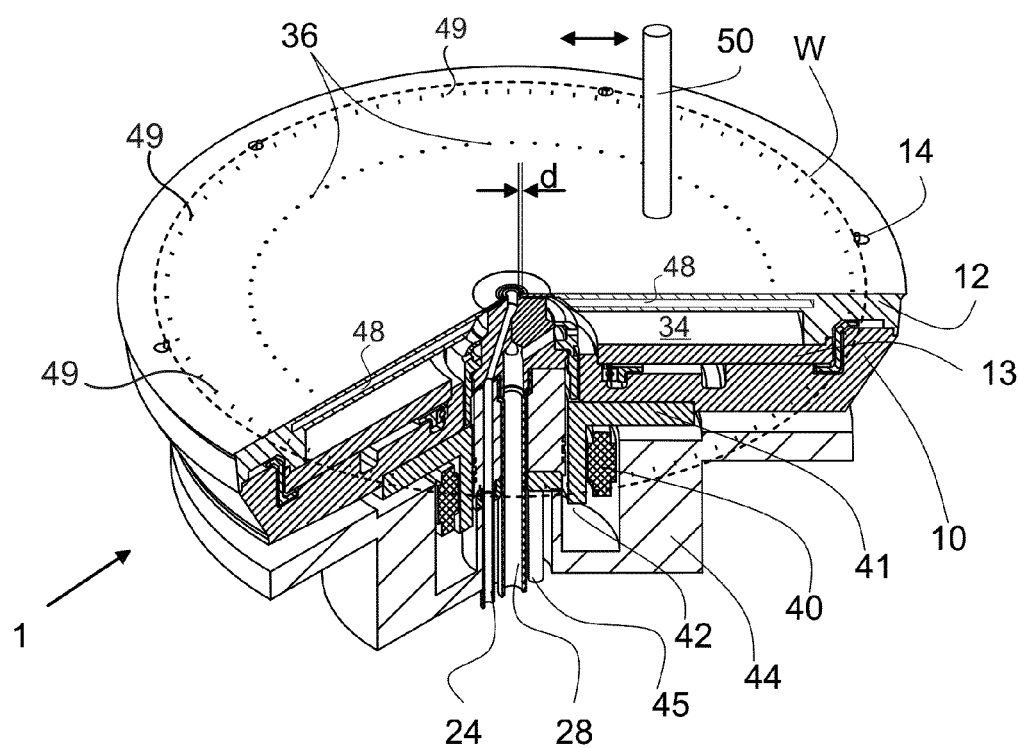
FIG. 4 shows further details of a wet treatment apparatus according to an embodiment of the present invention in a cross-sectional perspective view.

As can be seen in FIG. 4, edge rinsing nozzles 49 are arranged in a circle that is concentric with and outside the circle defined by gas nozzles 36. Pins 13 are positioned to support the edge of a wafer positioned on the chuck with the pins 13 in their closed (radially inward) position. In this embodiment, the pins are positioned so as to support a wafer of 300 mm diameter, but the devices according to the invention can be made to support larger or smaller diameter wafers as well, e.g., 200 mm or 450 mm wafers.

The exit ends of edge rinsing nozzles 49 are preferably positioned from 0.3 mm to 50 mm from the edge of a wafer when positioned on the chuck, or, stated differently, from a circle defined by the contact surfaces of pins 13. More preferably that distance is from 0.5 to 25 mm, and still more preferably from 1 to 10 mm. The exit ends of gas nozzles 36 are preferably positioned from 5 to 50 mm from the exit ends of edge rinsing nozzles 49, more preferably from 10 to 40 mm, and most preferably from 15 to 25 mm.

From FIG. 4 it can be seen that there are a large number of edge rinsing nozzles 49, in this embodiment about 100. Alternatively, a continuous annular nozzle could be provided in place of separate nozzles, or a smaller number of arcuate nozzles each extending over a part of the circle described by the series of nozzles in FIG. 4. In the case of circular nozzles 49 preferably at least 20 such nozzles are provided.

As can be seen in FIGS. 1 and 4, the gas nozzles 36 open on a face of the spin chuck 3 that faces upwardly toward a wafer W positioned on the spin chuck. The gas exiting from nozzles 36 is vented across the surface of cover 12, within the gap 38 between the wafer W and the chuck 3. Thus, when gas, such as nitrogen gas, is supplied through nozzles 36 simultaneously with a liquid, such as deionized water, being supplied through edge rinse nozzles 49, the gas and water are permitted to commingle in the region radially outward of the outlet openings of the edge rinse nozzles 49. However, the outward flow of the gas prevents the liquid being dispensed through edge rinse nozzles 49 from wetting the central region of the first side of the wafer W.

Figure 2:
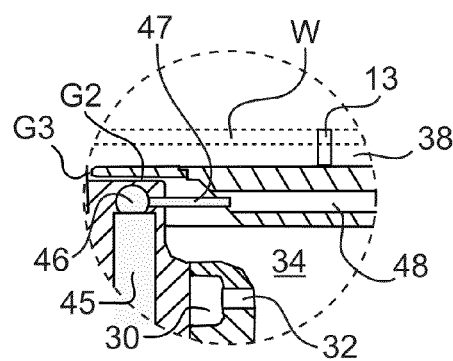
FIG. 2 is an enlarged view of the detail II in FIG. 1.

As can be seen in FIG. 2, the gas distribution chamber 34 and the rotating liquid conduit 48 communicate with one another. Thus, a positive pressure of gas within distribution chamber 34 prevents liquid in rotating conduit 48 from radially inward egress into chamber 34, thereby acting as a gas seal for the rotating liquid conduit 48. Furthermore, some mixing of the gas and liquid may occur in the rotating liquid conduit upstream of nozzles 36 and 49.

The gas supplied through nozzles 36 may support the wafer W, when chuck 3 is designed to operate according to the Bernoulli principle. Alternatively, pins 13 may provide both lateral and subjacent support for the wafer W, in which case the gripping surfaces of pins 13 will be scalloped rather than purely cylindrical.

In operation, a wafer is loaded onto the spin chuck, either by placing it onto the gas cushion of the spin chuck provided by gas, which is introduced through gas nozzles 36, or by clamping the wafer in place with pins 13.

Then the chuck is rotated and treatment liquid (e.g. an etchant) is dispensed onto the top surface of the wafer through liquid dispense nozzle 50. The liquid radially flows towards the wafer's edge and is spun off the wafer. The downwardly-facing wafer side is protected during this time by a flow of nitrogen gas provided through nozzles 36, while no liquid is dispensed through the edge rinse nozzles 49.

After treatment with the etchant is complete, the wafer is rinsed with deionized water. In particular, deionized water is dispensed onto the top surface of the wafer W through liquid dispense nozzle, and deionized water is simultaneously dispensed through supply line 45, annular distribution conduit 46, non-rotating nozzles 47, rotating conduit 48 and edge rinsing nozzles 49 onto the first side of the wafer W but only in the peripheral region thereof. As deionized water is dispensed through the edge rinsing nozzles 49, nitrogen gas is simultaneously discharged through the gas nozzles 36, so as to protect the central region of the first side of the wafer W and specifically so as to prevent the liquid from nozzles 49 from contacting the central region of the wafer first side.

In a subsequent process step, both sides of the wafer are then dried with a drying gas, e.g. nitrogen or a nitrogen isopropyl alcohol mixture. The first side can be dried using gas supplied through gas nozzles 36 while no liquid is supplied through edge rinse nozzles 49. The upper side of wafer W is dried with drying gas supplied through conduit 50 or through a separate gas conduit or showerhead (not shown).

It will be understood that the foregoing description and specific embodiments shown herein are merely illustrative of the invention and the principles thereof, and that modifications and additions may be easily made by those skilled in the art without departing for the spirit and scope of the invention, which is therefore understood to be limited only by the scope of the appended claims.

What is claimed is:

1. A device for wet treatment of a plate-like article comprising:
   a spin chuck for holding and rotating the plate-like article,
   gas supply nozzles positioned in a rotating surface of the spin chuck facing a first side of the plate-like article, wherein the spin chuck is configured to direct gas discharged from the gas supply nozzles radially outwardly through a gap defined between an upper surface of the spin chuck and a downwardly facing surface of a plate-like article positioned on the spin chuck; and
   liquid supply nozzles opening on said rotating surface of the spin chuck facing a first side of the plate-like article and positioned radially outwardly of said gas supply nozzles, said liquid supply nozzles being positioned beneath a peripheral region of a plate-like article positioned on the spin chuck.

2. The device according to claim 1, wherein the spin chuck is adapted to hold a semiconductor wafer in a process module for single wafer wet processing.

3. The device according to claim 1, wherein the spin chuck comprises a circular series of gripping pins having contact surfaces which, in a closed position of said gripping pins, describe a circle whose diameter corresponds to that of an article to be held by the spin chuck.

4. The device according to claim 1, wherein the spin chuck comprises a stationary central manifold and a rotary holding portion surrounding an upper part of the stationary central manifold, the stationary central manifold including supply conduits leading to said gas supply nozzles and said liquid supply nozzles.

5. The device according to claim 4, wherein said rotary holding portion of said spin chuck comprises a rotating liquid conduit communicating with a liquid supply conduit in the stationary central manifold and the liquid supply nozzles.

6. The device according to claim 4, wherein said rotary holding portion of said spin chuck comprises a rotating gas chamber communicating with a gas supply conduit in the stationary central manifold and the gas supply nozzles.

7. The device according to claim 5, wherein said rotary holding portion of said spin chuck comprises a rotating gas chamber communicating with a gas supply conduit in the stationary central manifold and the gas supply nozzles, the rotating gas chamber further communicating with the rotating liquid conduit.

8. The device according to claim 1, wherein the liquid supply nozzles are arranged in a circle with outlet ends thereof directed upwardly and outwardly from a central portion of said spin chuck.

9. A method of wet treating a plate-like article comprising:
positioning a plate-like article on a spin chuck,
rotating the plate-like article with the spin chuck, while supplying gas to a first side of the plate-like article through gas supply nozzles positioned in a rotating surface of the spin chuck facing the first side of the plate-like article,
directing gas discharged from the gas supply nozzles radially outwardly through a gap defined between an upper surface of the spin chuck and a downwardly facing surface of the plate-like article positioned on the spin chuck; and
simultaneously supplying a liquid to only a peripheral region of the first side of the plate-like article through liquid supply nozzles opening on the rotating surface of the spin chuck facing the first side of the plate-like article, and positioned radially outwardly of the gas supply nozzles, the liquid supply nozzles being positioned beneath a peripheral region of a plate-like article positioned on the spin chuck.

10. The method according to claim 9, wherein prior to supplying liquid to a first side of the plate-shaped article, an etching liquid is dispensed onto an upper surface of the plate-like article while gas is supplied to the lower surface of the plate-shaped article.

11. The method according to claim 9, wherein during supplying liquid to a first side of the plate-shaped article, a rinsing liquid is dispensed onto an upper surface of the plate-like article while gas is supplied to the lower surface of the plate-shaped article.

12. The method according to claim 9, wherein the liquid supplied to only a peripheral region of the first side of the plate-like article is deionized water.

13. The method according to claim 9, further comprising supplying gas to the gas supply nozzles such that the gas creates a gas seal confining the liquid within a rotating liquid conduit upstream of the liquid supply nozzles.

14. The method according to claim 9, wherein the gas supplied through the gas supply nozzles and the liquid supplied through the liquid supply nozzles are intermingled in a region radially outwardly of the liquid supply nozzles.

15. The method according to claim 9, wherein the gas supplied through the gas supply nozzles and the liquid supplied through the liquid supply nozzles are mixed upstream of the gas supply nozzles and the liquid supply nozzles.

16. The device according to claim 1, wherein said liquid supply nozzles are positioned in said rotating surface of the spin chuck facing a first side of the plate-like article.

17. The method according to claim 9, wherein the liquid supply nozzles are positioned in the rotating surface of the spin chuck facing a first side of the plate-like article.

* * * * *